United States Patent
Zhou

(10) Patent No.: US 11,088,176 B2
(45) Date of Patent: Aug. 10, 2021

(54) DISPLAY DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventor: Mancheng Zhou, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 322 days.

(21) Appl. No.: 16/311,962

(22) PCT Filed: Sep. 7, 2018

(86) PCT No.: PCT/CN2018/104601
§ 371 (c)(1),
(2) Date: Dec. 20, 2018

(87) PCT Pub. No.: WO2019/161656
PCT Pub. Date: Aug. 29, 2019

(65) Prior Publication Data
US 2020/0411556 A1 Dec. 31, 2020

(30) Foreign Application Priority Data

Feb. 26, 2018 (CN) .......................... 201820271862.1

(51) Int. Cl.
*H01L 27/12* (2006.01)
*G02F 1/1335* (2006.01)
(Continued)

(52) U.S. Cl.
CPC ........ *H01L 27/124* (2013.01); *G02F 1/13452* (2013.01); *G02F 1/133514* (2013.01);
(Continued)

(58) Field of Classification Search
CPC ............... H01L 27/124; H01L 27/3276; G02F 1/133514; G02F 1/13452; G02F 1/136286
(Continued)

(56) References Cited

U.S. PATENT DOCUMENTS

2009/0184931 A1* 7/2009 Yang ..................... G06F 3/045
345/173
2013/0321478 A1* 12/2013 Zheng .................. G09G 3/2092
345/690

FOREIGN PATENT DOCUMENTS

CN 1928978 3/2007
CN 1928978 A 3/2007
(Continued)

OTHER PUBLICATIONS

International Search Report filed in PCT/CN2018/104601 dated Dec. 4, 2018.
(Continued)

*Primary Examiner* — Igwe U Anya
(74) *Attorney, Agent, or Firm* — Westbridge IP LLC

(57) ABSTRACT

The present disclosure provides a display device including an array substrate. At least one wiring on array is arranged on a surface of the array substrate, the wiring on array including a plurality of signal wires, and all the signal wires of the wiring on array being the same in impedance and different in length and in cross-sectional area. At least one first driving component is arranged at one side of the array substrate, adjacent first driving components being electrically connected via one wiring on array. At least one second driving component is arranged at the same side or different
(Continued)

sides of the array substrate as the first driving member, adjacent second driving components being electrically connected via one wiring on array or adjacent first and second driving components being electrically connected via one wiring on array.

17 Claims, 3 Drawing Sheets

(51) Int. Cl.
*G02F 1/1345* (2006.01)
*G02F 1/1362* (2006.01)
*G02F 1/1333* (2006.01)
*H01L 27/32* (2006.01)

(52) U.S. Cl.
CPC .. *G02F 1/136286* (2013.01); *G02F 1/133302* (2021.01); *H01L 27/3276* (2013.01)

(58) Field of Classification Search
USPC .......................................................... 257/72
See application file for complete search history.

(56) References Cited

FOREIGN PATENT DOCUMENTS

| | | |
|---|---|---|
| CN | 102682694 A | 9/2012 |
| CN | 104076544 A | 10/2014 |
| CN | 105242466 A | 1/2016 |
| KR | 20080051259 | 6/2008 |
| KR | 20080051259 A | 6/2008 |

OTHER PUBLICATIONS

International Search Report and Written Opinion in corresponding PCT Application No. PCT/CN2018/104601, dated Dec. 4, 2018.

* cited by examiner

DISPLAY DEVICE

CROSS-REFERENCES TO RELATED APPLICATION

This application is the International Application No. PCT/CN2018/104601 for entry into US national phase with an international filing date of Sep. 7, 2018 designating US, now pending, and claims priority to Chinese Patent Application 201820271862.1, filed on Feb. 26, 2018, the contents of which is incorporated herein by reference in its entirety.

BACKGROUND

Embodiments of the present disclosure relates to the technical field of circuit board wiring, and in particular, to a display device.

Wiring is an important part of circuit board design and widely used in the wiring design of various common circuit boards, for example, in the wiring design of thin film transistor-liquid crystal displays (TFT-LCD). The impedance difference between the signal wires of the wiring on array causes a RC delay, which results in signal delays between the signal wires, for example, thereby causing split-screen phenomenon or mura of the TFT-LCD, which seriously affects the display effect of the TFT-LCD.

In the existing manner of wiring on array, in order to reduce the impedance difference between the signal wires, copper is usually selected to make the signal wires, which greatly increases the cost and can only reduce the impedance difference caused by the difference in the length of the lines.

SUMMARY

An embodiment of the present disclosure provides a display device which can effectively reduce the impedance difference between the signal lines and has no absolute restriction on the manufacturing material of the signal lines.

According to an embodiment of the present disclosure, a display device comprises:

a display device comprises:

an array substrate;

at least one wiring on array arranged on a surface of the array substrate, wherein the wiring on array comprises a plurality of signal wires, and all the signal wires of the wiring on array are the same in impedance and different in length and in cross-sectional area;

at least one first driving component arranged at one side of the array substrate, wherein the first driving components which are adjacent to each other is electrically connected to each other via one of the at least one wiring on array; and at least one second driving component arranged at the same side or different sides of the array substrate as the first driving member, wherein the second driving components which are adjacent to each other is electrically connected to each other via one of the at least one wiring on array or the first and second driving components which are adjacent to each other is electrically connected to each other via one of the at least one wiring on array.

In one embodiment, all the signal wires of the wiring on array are the same in impedance and cross-sectional width, and different in length and cross-sectional thickness.

In one embodiment, a reference signal wire is included in all the signal wires, and a relationship between any other signal wire of all the signal wires and the reference signal wire is as follow:

$$ai = a0*b0*\rho i*Li/\rho 0*L0*bi = a0*Li*\rho i/\rho 0*L0;$$

wherein ai is the cross-sectional thickness of any other signal wire, a0 is the cross-sectional thickness of the reference signal wire, b0 is the cross-sectional width of the reference signal wire, $\rho i$ is the resistivity of any other signal wire, Li is the length of any other signal wire, $\rho 0$ is the resistivity of the reference signal wire, L0 is the length of the reference signal wire, and bi is the cross-sectional width of any other signal wire.

In one embodiment, all the signal wires are the same in resistivity, and a relationship between any other signal wire of all the signal wires and the reference signal wire is as follow:

$$ai = a0*Li/L0.$$

In one embodiment, all the signal wires of the wiring on array are the same in impedance and cross-sectional thickness, and different in length and cross-sectional width.

In one embodiment, a reference signal wire is included in all the signal wires, and a relationship between any other signal wire of all the signal wires and the reference signal wire is as follow:

$$bi = a0*b0*\rho i*Li/\rho 0*L0*ai = b0*\rho i*Li/\rho 0*L0;$$

wherein ai is the cross-sectional thickness of any other signal wire, a0 is the cross-sectional thickness of the reference signal wire, b0 is the cross-sectional width of the reference signal wire, $\rho i$ is the resistivity of any other signal wire, Li is the length of any other signal wire, $\rho 0$ is the resistivity of the reference signal wire, L0 is the length of the reference signal wire, and bi is the cross-sectional width of any other signal wire.

In one embodiment, all the signal wires are the same in resistivity, and a relationship between any other signal wire of all the signal wires and the reference signal wire is as follow:

$$bi = b0*Li/L0.$$

In one embodiment, the reference signal wire is a signal wire having the shortest or longest length among all the signal wires.

In one embodiment, all the signal wires of the wiring on array are the same in impedance and different in length, cross-sectional width, and cross-sectional thickness.

In one embodiment, a reference signal wire is included in all the signal wires, and a relationship between any other signal wire of all the signal wires and the reference signal wire is as follow:

$$ai = a0*b0*\rho i*Li/\rho 0*L0*bi;$$

wherein ai is the cross-sectional thickness of any other signal wire, a0 is the cross-sectional thickness of the reference signal wire, b0 is the cross-sectional width of the reference signal wire, $\rho i$ is the resistivity of any other signal wire, Li is the length of any other signal wire, $\rho 0$ is the resistivity of the reference signal wire, L0 is the length of the reference signal wire, and bi is the cross-sectional width of any other signal wire.

In one embodiment, all the signal wires are the same in resistivity, and a relationship between any other signal wire of all the signal wires and the reference signal wire is as follow:

$$ai = a0*b0*Li/L0*bi.$$

In one embodiment, the reference signal wire is a signal wire having the shortest or longest length among all the signal wires.

In one embodiment, the first driving component and the second driving component are the same components and are arranged at the same side of the array substrate; and the first driving component and the second driving component are scan driving ICs or data driving ICs.

In one embodiment, the first driving component and the second driving component are different components and are arranged at different sides of the array substrate; and one of the first driving component and the second driving component is a scan driving IC and the other one is a data driving IC.

In one embodiment, all the signal wires comprise at least one of a copper wire, an aluminum wire, a tin wire, a silver wire, or a gold wire.

In one embodiment, the array substrate is a glass substrate.

In one embodiment, the respective signal wires of the plurality of signal wires are arranged side by side, not overlapped or intersected with each other.

In one embodiment, the display device further comprises a filter substrate, a pixel array and the array substrate sequentially stacked together, the filter substrate covering the pixel array and defining a gap with the first driving component and the second driving component.

In one embodiment, the pixel array comprising a plurality of sub-pixels regularly arranged in any pattern.

An embodiment of the present disclosure provides a display device including a wiring on array which is composed of a plurality of signal wires with the same impedance and different length and cross-sectional area, which can not only reduce the impedance difference between the signal wires due to the difference in the length of the lines but make the material of the signal wires unrestricted as well so that any conductive material can be selected according to actual needs.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure, for those skilled in the art, other drawings may be obtained based on these drawings without paying any creative work.

DESCRIPTION OF THE PREFERRED EMBODIMENTS

In order to enable those skilled in the art to better understand the solutions of the present disclosure, the technical solutions in the embodiments of the present disclosure are clearly described in the following with reference to the accompanying drawings in the embodiments of the present disclosure. It is obvious that the described embodiments are only some instead of all embodiments the present disclosure. Based on the embodiments of the present disclosure, all other embodiments obtained by those skilled in the art without paying any creative work should be included within the scope of the present disclosure.

The term "comprising" and variations in the specification, claims and above description of the drawings of the present disclosure are intended to cover a non-exclusive inclusion. For example, a process, method or system, product or device comprising a series of steps or units is not limited to the listed steps or units, but optionally also includes steps or units not listed, or optionally also includes other steps or units inherent to the process, method, product or device. Moreover, the terms "first", "second", and "third," etc are used to distinguish different objects and are not intended to describe a particular order.

Figure 1:
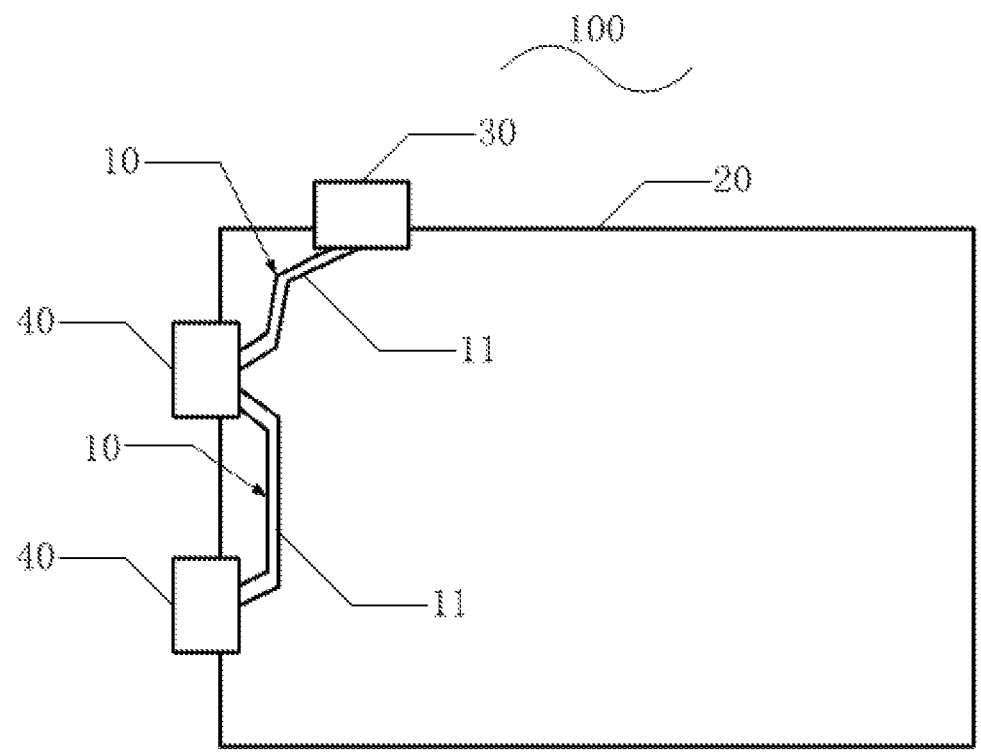
FIG. 1 is a schematic structural diagram of a display device according to an embodiment of the present disclosure.

As shown in FIG. 1, an embodiment of the present disclosure provides a display device 100 including at least one wiring on array (WOA) 10, an array substrate 20, at least one first driving component 30 and at least one second driving component 40.

In one application, the array substrate may be any substrate for arranging the components with array configuration, for example, the array substrate may be a glass substrate for disposing a pixel array.

The wiring on array 10 is arranged on a surface of the array substrate 20. The wiring on array 10 includes a plurality of signal wires 11. All the signal wires 11 of the wiring on array 10 are the same in impedance and different in length and cross-sectional area, that is, the lengths and the cross-sectional areas of all the signal wires 11 of each wiring on array are respectively different.

In applications, the fact of the cross-sectional areas being different includes three cases. One is that the cross-sectional widths are the same and the cross-sectional thicknesses are different, the second one is that the cross-sectional widths are different and the cross-sectional thicknesses are the same, and the third one is that the cross-sectional widths and the cross-sectional thicknesses are both different.

In this embodiment, the impedance is equal to the ratio of the product of the resistivity and the length to the cross-sectional area. Setting the impedance to R, the resistivity to ρ, the cross-sectional area to S and the length to L, then R=ρL/S. The cross-sectional area refers to the area of a cross section of the signal wire perpendicular to the signal wire and the plane of the array substrate, the cross-sectional thickness is a width perpendicular to the plane of the array substrate, and the cross-sectional width is a width parallel to the plane of the array substrate.

The first driving component 30 is arranged at one side of the array substrate 20 and the adjacent first driving components 30 are electrically connected to each other via a wiring on array 10.

The second driving component 40 is arranged at the same or different side of the array substrate 20 as the first driving member 30, the adjacent second driving components 40 are electrically connected to each other via a wiring on array 10, and the adjacent first and second driving components 30 and 40 are electrically connected to each other via a wiring on arrays 10.

In one application, the first driving component and the second driving component may be the same or different components, and the number of the first driving component and the number of the second driving component may also be set according to actual needs, and between any two adjacent driving components a wiring on array is arranged and the signal transmission between the adjacent driving components are realized via the wiring on array.

In one application, the first driving component or the second driving component may be a scan driving integrated circuit (IC) or a data driving IC.

In one application, the scan driving IC may be a gate driving IC and the data driving IC may be a source driving IC.

In one application, the first driving component and the second driving component are the same components and are arranged at the same side of the array substrate.

The first driving component and the second driving component are both a scan driving IC or a data driving IC.

In one application, the first driving component and the second driving component are different components and are arranged at different sides of the array substrate.

One of the first driving component and the second driving component is a scan driving IC and the other one is a data driving IC.

In FIG. 1 one first driving component 30 and two second driving components 40 are exemplarily shown, a wiring on array 10 is arranged between the first driving component 30 and one second driving component 40 and a wiring on array 10 is arranged between the two second driving components 40.

In one application, the number of the signal wires included in the wiring on array may be set according to actual needs, for example, the number may be set as two, three, or any other number.

FIG. 1 exemplarily shows that the wiring on array 10 includes two signal wires 11.

In one application, for the good looking and space saving of the wiring, the spacing between adjacent signal wires is the minimum distance that can be achieved, and the signal wires are arranged side by side, not overlapped or intersected with each other.

In one application, the impedance of the signal wire is equal to the ratio of the product of the resistivity and the length to the cross-sectional area, and the resistivity is related to the material of the signal wire, the cross-sectional area is related to the cross-sectional thickness and the cross-sectional width of the signal wire, therefore, in order to make the impedances of the respective signal wires the same and reduce the impedance difference between the signal wires, it is necessary to make the lengths, the material, the cross-sectional thicknesses and the cross-sectional widths of the respective signal wires have certain relationship.

In one application, the signal wire may be any conductive line selected according to actual needs. For example, the signal wire includes at least one of a copper wire, an aluminum wire, a tin wire, a silver wire, or a gold wire.

In one embodiment, all the signal wires are the same in resistivity, i.e., the respective signal wires are made of the same material.

In one application, the impedances of the respective signal wires may be made the same by changing the cross-sectional widths or cross-sectional thicknesses of the respective signal wires in the case where all the signal wires are the same in resistivity and different in length. For example, it may be realized by making the cross-sectional thickness of all the signal wires the same and the cross-sectional width different, or making the cross-sectional thickness different and the cross-sectional width the same. Of course, it may alternatively be realized by making all of the lengths, the resistivities, the cross-section thicknesses and the cross-sectional widths of all the signal wires different, as long as the impedances are the same.

In one disclosure, in order to facilitate the introduction of the impedance calculation principle of the signal wire, for each wiring on array, one of all the signal wires included therein is used as a reference signal wire, and then the size and the resistance characteristic parameter of the reference signal wire are used as standard values to calculate the sizes of other signal wires.

In one embodiment, in the case where all the signal wires of the wiring on array have the same impedances and cross-sectional widths and different lengths and cross-sectional thicknesses, the relationship between any other signal wire and the reference signal wire is as follow.

$$ai = a0*b0*\rho i*Li/\rho 0*L0*bi = a0*Li*\rho i/\rho 0*L0;$$

In the formula, ai is the cross-sectional thickness of any other signal wire, a0 is the cross-sectional thickness of the reference signal wire, b0 is the cross-sectional width of the reference signal wire, ρi is the resistivity of any other signal wire, Li is the length of any other signal wire, ρ0 is the resistivity of the reference signal wire, L0 is the length of the reference signal wire, and bi is the cross-sectional width of any other signal wire.

In the case where all the signal wires of the wiring on array are the same in impedance, cross-sectional width and resistivity and different in length and cross-sectional thickness, the relationship between any other signal wire and the reference signal wire is as follow.

$$ai = a0*Li/L0;$$

In the above embodiment, by making the cross-sectional widths and resistivities of all the signal wires the same, in the case where the lengths of the respective signal wires are different, to make the impedances of the respective signal wires the same it is only necessary to change the cross-sectional thicknesses of the signal wires. Meanwhile, in order to facilitate the setting of the cross-sectional thicknesses of the respective signal wires, any one of the signal wires can be selected as the reference signal wire, and then the length and the cross-sectional width of the reference signal wire are used as references to correspondingly set the cross-sectional thicknesses of the other signal wires.

Figure 2:
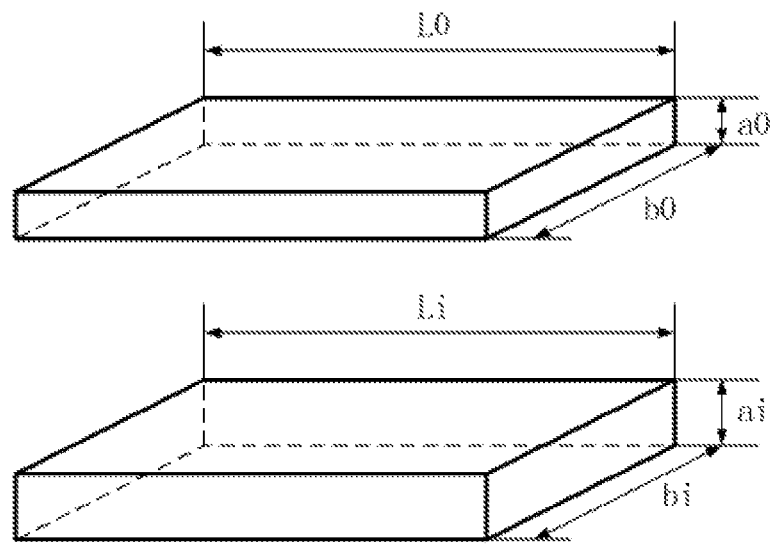
FIG. 2 is a schematic structural diagram of one reference signal wire and one other signal wire according to an embodiment of the present disclosure.

FIG. 2 exemplarily shows a schematic structural diagram of one reference signal wire and one other signal wire with the same impedances, in this embodiment the cross-sectional widths and the resistivities being respectively the same.

In another embodiment, in the case where all the signal wires of the wiring on array have the same impedances and cross-sectional thicknesses and different lengths and cross-sectional widths, the relationship between any other signal wire of all the signal wires and the reference signal wire is as follow.

$$bi = a0*b0*\rho i*Li/\rho 0*L0*ai = b0*\rho i*Li/\rho 0*L0;$$

In the formula, ai is the cross-sectional thickness of any other signal wire, a0 is the cross-sectional thickness of the reference signal wire, b0 is the cross-sectional width of the reference signal wire, ρi is the resistivity of any other signal wire, Li is the length of any other signal wire, ρ0 is the resistivity of the reference signal wire, L0 is the length of the reference signal wire, and bi is the cross-sectional width of any other signal wire.

In the case where all the signal wires of the wiring on array are the same in impedance, cross-sectional thickness and resistivity and different in length and the cross-sectional width, the relationship between any other signal wire of all the signal wires and the reference signal wire is as follow.

$$bi=b0*Li/L0.$$

In the above embodiment, by making the cross-sectional thicknesses and resistivities of all the signal wires the same, in the case where the lengths of the respective signal wires are different, to make the impedances of the respective signal wires the same it is only necessary to change the cross-sectional widths of the signal wires. Meanwhile, in order to facilitate the setting of the cross-sectional widths of the respective signal wires, any one of the signal wires can be selected as the reference signal wire, and then the length and the cross-sectional thickness of the reference signal wire are used as references to correspondingly set the cross-sectional widths of the other signal wires.

Figure 3:
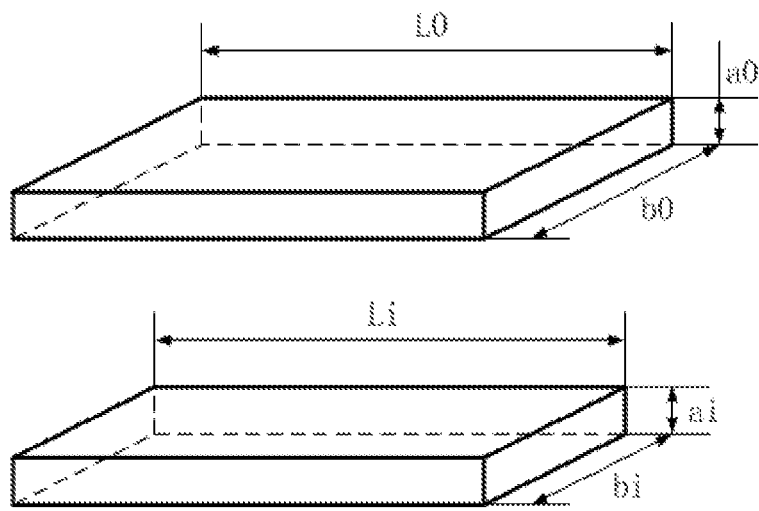
FIG. 3 is a schematic structural diagram of one reference signal wire and one other signal wire according to another embodiment of the present disclosure.

FIG. 3 exemplarily shows a schematic structural diagram of one reference signal wire and one other signal wire with the same impedances, in this embodiment the cross-sectional thicknesses and the resistivities being respectively the same.

In one embodiment, in the case where all the signal wires of the wiring on array have the same impedances and different lengths, cross-sectional widths, and cross-sectional thicknesses, the relationship between any other signal wire of all the signal wires and the reference signal wire is as follow.

$$ai=a0*b0*\rho i*Li/\rho 0*L0*bi;$$

In the formula, ai is the cross-sectional thickness of any other signal wire, a0 is the cross-sectional thickness of the reference signal wire, b0 is the cross-sectional width of the reference signal wire, $\rho i$ is the resistivity any other signal wire, Li is the length of any other signal wire, $\rho 0$ is the resistivity of the reference signal wire, L0 is the length of the reference signal wire, and bi is the cross-sectional width of any other signal wire.

In the case where all the signal wires of the wiring on array are the same in impedance and resistivity and different in length, cross-sectional width and cross-sectional thickness, the relationship between any other signal wire of all the signal wires and the reference signal wire is as follow.

$$ai=a0*b0*Li/L0*bi.$$

Figure 4:
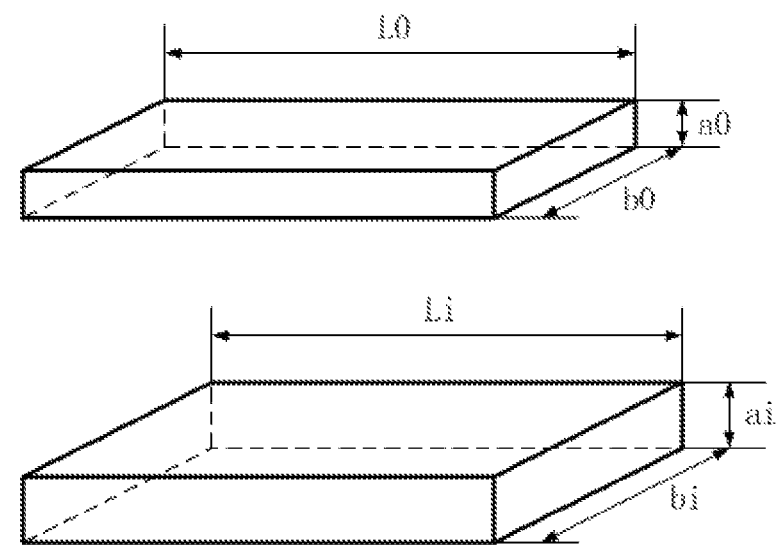
FIG. 4 is a schematic structural diagram of one reference signal wire and one other signal wire according to still another embodiment of the present disclosure.

FIG. 4 exemplarily shows a schematic structural diagram of one reference signal wire and one other signal wire with the same impedances, in this embodiment the resistivities being the same.

In one application, the reference signal wire can be any one of all the signal wires, such as the shortest or longest signal wire.

An embodiment of the present disclosure provides a display device including a wiring on array which is composed of a plurality of signal wires with the same impedances and different lengths and cross-sectional areas, which can not only reduce the impedance difference between the signal wires due to the difference in the length of the lines but cause the material of the signal wires to be unrestricted as well so that any conductive material can be selected according to actual needs.

Figure 5:
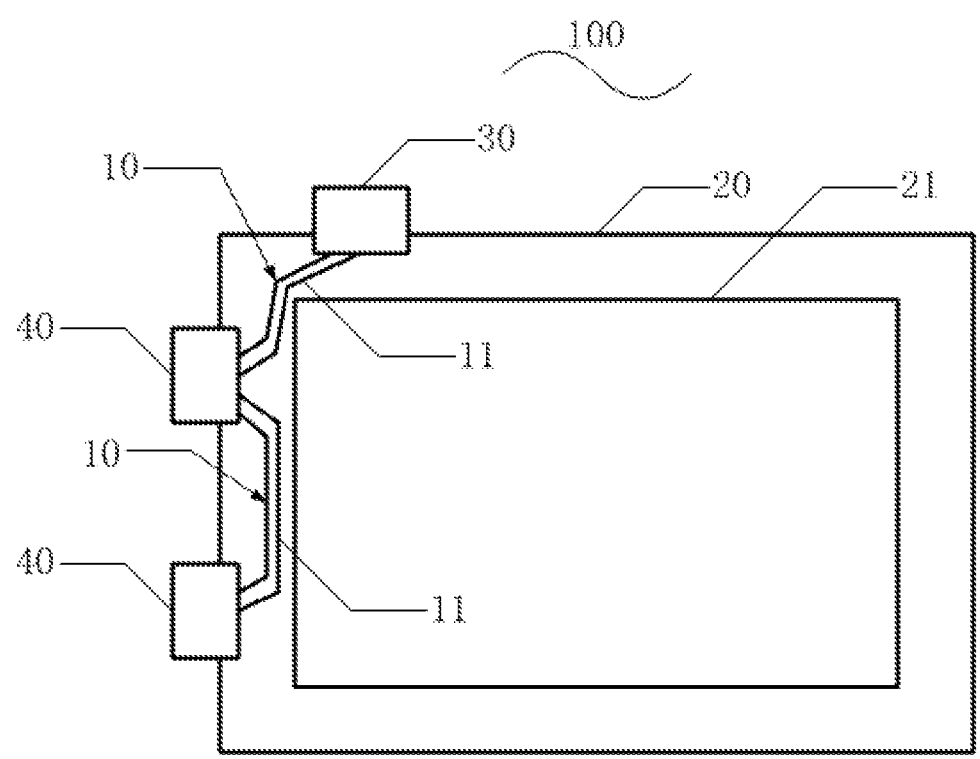
FIG. 5 is a schematic structural diagram of a display device according to another embodiment of the present disclosure.

As shown in FIG. 5, in an embodiment of the present disclosure, the display device 100 in the embodiment corresponding to FIG. 1 further includes a pixel array 21.

The pixel array 21 is arranged on the surface of the array substrate 20 and both the first driving component 30 and the second driving component 40 are electrically connected to the pixel array 21.

In FIG. 5, one first driving component 30 and two second driving components 40 are exemplarily shown, in which the first driving member 30 and the second driving members 40 are respectively arranged at different sides of the array substrate 20, the adjacent first and second driving components 30 and 40 are electrically connected to each other via a wiring on array 10, and the adjacent two second driving components 40 are electrically connected to each other via another wiring on array 10. The connecting wires between the respective driving components and the pixel array are not shown in FIG. 5.

In one application, the display device may be any type of display device, such as a liquid crystal display device based on liquid crystal display (LCD) technology, an organic electro laser display device based on organic light-emitting diodes (OLED) technology, a quantum dot light-emitting diode display device based on quantum dot light-emitting diodes (QLED) technology, a curved display device, or the like.

In one embodiment, the display device includes a filter substrate, a pixel array and an array substrate sequentially stacked together, the filter substrate covers the pixel array and defines a gap with the first driving component and the second driving component, and the portion of the fan-out wire structure at the gap is a straight line segment.

In one application, the filter substrate may be any substrate capable of filtering light, such as a color filter substrate composed of color filters.

In one application, the pixel array may include a plurality of sub-pixels that are regularly arranged in any pattern, for example, the pixel array may include a plurality of rows of sub-pixels that are regularly arranged in a rectangular shape. Each row of sub-pixels in the pixel array includes a plurality of sets of sub-pixels, each set of sub-pixels includes a first color sub-pixel, a second color sub-pixel, and a third color sub-pixel sequentially arranged, the colors of the sub-pixels in the same column are the same, and at least one of the first to third color sub-pixels is a red sub-pixel, at least one of the first to third color sub-pixels is a green sub-pixel, and at least one of the first to third color sub-pixels is a blue sub-pixel.

The above description is only the preferred embodiment of the present disclosure, and is not intended to limit the present disclosure. Any modifications, equivalent substitutions and improvements made within the spirit and principles of the present disclosure are included within the protection scope of the present disclosure.

What is claimed is:

1. A display device, comprising:
    an array substrate;
    at least one wiring on array arranged on a surface of the array substrate, wherein the wiring on array comprises a plurality of signal wires, and all the signal wires of the wiring on array are the same in impedance and different in length and in cross-sectional area;
    at least one first driving component arranged at one side of the array substrate, wherein the first driving components which are adjacent to each other is electrically connected to each other via one of the at least one wiring on array; and
    at least one second driving component arranged at the same side or different sides of the array substrate as the first driving member, wherein the second driving components which are adjacent to each other is electrically connected to each other via one of the at least one wiring on array or the first and second driving components which are adjacent to each other is electrically connected to each other via one of the at least one wiring on array;

wherein all the signal wires comprise at least one of a copper wire, an aluminum wire, a tin wire, a silver wire, or a gold wire.

2. The display device according to claim 1, wherein all the signal wires of the wiring on array are the same in impedance and cross-sectional width and different in length and cross-sectional thickness.

3. The display device according to claim 2, wherein a reference signal wire is included in all the signal wires, and a relationship between any other signal wire of all the signal wires and the reference signal wire is as follow:

$$ai=a0*b0*\rho i*Li/\rho 0*L0*bi=a0*Li*\rho i/\rho 0*L0;$$

wherein ai is the cross-sectional thickness of any other signal wire, a0 is the cross-sectional thickness of the reference signal wire, b0 is the cross-sectional width of the reference signal wire, ρi is the resistivity of any other signal wire, Li is the length of any other signal wire, ρ0 is the resistivity of the reference signal wire, L0 is the length of the reference signal wire, and bi is the cross-sectional width of any other signal wire.

4. The display device according to claim 3, wherein all the signal wires are the same in resistivity, and a relationship between any other signal wire of all the signal wires and the reference signal wire is as follow:

$$ai=a0*Li/L0.$$

5. The display device according to claim 3, wherein the reference signal wire is a signal wire having the shortest or longest length among all the signal wires.

6. The display device according to claim 1, wherein all the signal wires of the wiring on array are the same in impedance and cross-sectional thickness, and different in length and cross-sectional width.

7. The display device according to claim 6, wherein a reference signal wire is included in all the signal wires, and a relationship between any other signal wire of all the signal wires and the reference signal wire is as follow:

$$ai=a0*b0*\rho i*Li/\rho 0*L0*bi=a0*Li*\rho i/\rho 0*L0;$$

wherein ai is the cross-sectional thickness of any other signal wire, a0 is the cross-sectional thickness of the reference signal wire, b0 is the cross-sectional width of the reference signal wire, ρi is the resistivity of any other signal wire, Li is the length of any other signal wire, ρ0 is the resistivity of the reference signal wire, L0 is the length of the reference signal wire, and bi is the cross-sectional width of any other signal wire.

8. The display device according to claim 7, wherein all the signal wires are the same in resistivity, and a relationship between any other signal wire of all the signal wires and the reference signal wire is as follow:

$$ai=a0*Li/L0.$$

9. The display device according to claim 1, wherein all the signal wires of the wiring on array are the same in impedance and different in length, cross-sectional width, and cross-sectional thickness.

10. The display device according to claim 9, wherein a reference signal wire is included in all the signal wires, and a relationship between any other signal wire of all the signal wires and the reference signal wire is as follow:

$$ai=a0*b0*\rho i*Li/\rho 0*L0*bi;$$

wherein ai is the cross-sectional thickness of any other signal wire, a0 is the cross-sectional thickness of the reference signal wire, b0 is the cross-sectional width of the reference signal wire, ρi is the resistivity of any other signal wire, Li is the length of any other signal wire, ρ0 is the resistivity of the reference signal wire, L0 is the length of the reference signal wire, and bi is the cross-sectional width of any other signal wire.

11. The display device according to claim 10, wherein all the signal wires are the same in resistivity, and a relationship between any other signal wire of all the signal wires and the reference signal wire is as follow:

$$ai=a0*Li/L0.$$

12. The display device according to claim 1, wherein the first driving component and the second driving component are the same components and are arranged at the same side of the array substrate; and the first driving component and the second driving component are scan driving ICs or data driving ICs.

13. The display device according to claim 1, wherein the first driving component and the second driving component are different components and are arranged at different sides of the array substrate; and one of the first driving component and the second driving component is a scan driving IC and the other one is a data driving IC.

14. The display device according to claim 1, wherein the array substrate is a glass substrate.

15. The display device according to claim 1, wherein the respective signal wires of the plurality of signal wires are arranged side by side, not overlapped or intersected with each other.

16. The display device according to claim 1, further comprising: a filter substrate, a pixel array and the array substrate sequentially stacked together, the filter substrate covering the pixel array and defining a gap with the first driving component and the second driving component.

17. The display device according to claim 16, wherein the pixel array comprising a plurality of sub-pixels regularly arranged in any pattern.

* * * * *